(12) United States Patent
Chu et al.

(10) Patent No.: US 11,665,864 B2
(45) Date of Patent: May 30, 2023

(54) IMMERSION COOLING SYSTEM AND ELECTRONIC APPARATUS HAVING THE SAME

(71) Applicant: Wiwynn Corporation, New Taipei (TW)

(72) Inventors: Yu-Cheng Chu, New Taipei (TW); Chin-Hao Hsu, New Taipei (TW); Tsung-Han Li, New Taipei (TW); Ting-Yu Pai, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 115 days.

(21) Appl. No.: 17/397,981

(22) Filed: Aug. 9, 2021

(65) Prior Publication Data
US 2022/0361377 A1 Nov. 10, 2022

(30) Foreign Application Priority Data

May 7, 2021 (TW) .................................. 110116494

(51) Int. Cl.
*H05K 7/20* (2006.01)

(52) U.S. Cl.
CPC ......... *H05K 7/20818* (2013.01); *H05K 7/203* (2013.01); *H05K 7/20154* (2013.01); *H05K 7/20318* (2013.01); *H05K 7/20327* (2013.01)

(58) Field of Classification Search
CPC ........... H05K 7/20781; H05K 7/20272; H05K 7/20772; H05K 7/20254; H05K 7/20236; H05K 7/203; H05K 7/20381; H05K 7/20327; G06F 1/20; G06F 2200/201; G06F 1/206; F28D 15/00; F28D 15/0266

USPC ......... 361/679.53, 696, 701, 698, 702, 752; 165/104.33, 80.4, 104.21, 173

See application file for complete search history.

(56) References Cited

U.S. PATENT DOCUMENTS

| | | | |
|---|---|---|---|
| 10,123,463 B2 | 11/2018 | Best et al. | |
| 10,791,647 B1 * | 9/2020 | Miyamura | H05K 7/20272 |
| 10,939,581 B1 * | 3/2021 | Chen | H05K 7/20781 |
| 10,944,202 B1 * | 3/2021 | Tung | H05K 5/069 |
| 2011/0315355 A1 * | 12/2011 | Campbell | H05K 7/20809 |
| | | | 165/104.33 |

(Continued)

FOREIGN PATENT DOCUMENTS

| | | |
|---|---|---|
| CN | 105607715 | 7/2019 |
| CN | 112394792 | 2/2021 |
| TW | 202102101 | 1/2021 |

OTHER PUBLICATIONS

"Office Action of Taiwan Counterpart Application", dated Sep. 2, 2022, pp. 1-17.

*Primary Examiner* — Mandeep S Buttar
(74) *Attorney, Agent, or Firm* — JCIPRNET (57) ABSTRACT

An immersion cooling system including a rack and at least one immersion cooling module is provided. The immersion cooling module includes a chassis and a condensation pipeline. The chassis is slidably disposed on the rack and is adapted to accommodate a coolant. At least one heat generating component is adapted to be disposed in the chassis to be immersed in the liquid coolant. The condensation pipeline is disposed in the chassis and is located above the liquid coolant. In addition, an electronic apparatus having the immersion cooling system is also provided.

24 Claims, 11 Drawing Sheets

(56) References Cited

U.S. PATENT DOCUMENTS

| | | | |
|---|---|---|---|
| 2013/0312839 A1* | 11/2013 | Shelnutt | H05K 7/20772 137/15.01 |
| 2014/0133099 A1* | 5/2014 | Campbell | H05K 7/20818 361/698 |
| 2014/0146468 A1* | 5/2014 | Campbell | H05K 7/20809 361/699 |
| 2015/0109730 A1* | 4/2015 | Campbell | F28D 15/0266 165/104.27 |
| 2020/0284480 A1 | 9/2020 | Tolouei Asbforoushani et al. | |
| 2021/0274683 A1* | 9/2021 | Lee | H05K 7/20254 |
| 2022/0272874 A1* | 8/2022 | Gao | H05K 7/20272 |
| 2022/0322561 A1* | 10/2022 | Chehade | H05K 7/203 |
| 2023/0052701 A1* | 2/2023 | Chen | H05K 7/20781 |

* cited by examiner

IMMERSION COOLING SYSTEM AND ELECTRONIC APPARATUS HAVING THE SAME

CROSS-REFERENCE TO RELATED APPLICATION

This application claims the priority benefit of Taiwan application serial no. 110116494, filed on May 7, 2021. The entirety of the above-mentioned patent application is hereby incorporated by reference herein and made a part of this specification.

BACKGROUND

Technical Field

The disclosure relates to a cooling system and an electronic apparatus having the same, and more particularly to an immersion cooling system and an electronic apparatus having the same.

Description of Related Art

With the rapid development of server performance, high-performance servers generate a lot of waste heat. In order to avoid the accumulation of waste heat causing poor operation of the host, some servers are designed to immerse the motherboard in liquid coolant, which absorbs the heat generated by the heat generating elements of the motherboard and vaporizes and condenses on condensation pipelines. Droplets of the liquid coolant on the condensation pipelines fall back into the liquid coolant by gravity, achieving the effect of heat dissipation with this circulation, which is called two-phase immersion cooling technology in the industry. However, servers with immersion cooling technology generally use a huge box body to accommodate multiple motherboards, and the box body is difficult to be integrated into a slide rail rack. In addition, an opening end of the box body faces upwards and thus limits a direction of inserting and removing the motherboards in the box body to a top-bottom direction, which is relatively inconvenient in operation.

SUMMARY

The disclosure provides an immersion cooling system, in which an immersion cooling module may be integrated into a slide rail rack.

The immersion cooling system of the disclosure includes a rack and at least one immersion cooling module. The immersion cooling module includes a chassis and a condensation pipeline. The chassis is slidably disposed on the rack and is adapted to accommodate a coolant. At least one heat generating component is adapted to be disposed in the chassis to be immersed in the liquid coolant. The condensation pipeline is disposed in the chassis and is located above the liquid coolant.

The electronic apparatus of the disclosure includes at least one heat generating component and an immersion cooling system. The immersion cooling system includes a rack and at least one immersion cooling module. The immersion cooling module includes a chassis and at least one condensation pipeline. The chassis is slidably disposed on the rack and is adapted to accommodate a coolant. The heat generating component is disposed in the chassis to be immersed in the liquid coolant. The at least one condensation pipeline is disposed in the chassis and is located above the liquid coolant.

In an embodiment of the disclosure, the chassis is slidably disposed in a front-rear direction of the rack, and the at least one condensation pipeline is located above the liquid coolant in a top-bottom direction vertical to the front-rear direction of the rack.

In an embodiment of the disclosure, the rack has at least one condensation flow path, and the at least one condensation pipeline is adapted to be plugged to or unplugged from the at least one condensation flow path as the chassis slides along the rack.

In an embodiment of the disclosure, the at least one condensation flow path has two first connecting ends, the at least one condensation pipeline has two second connecting ends, and the two second connecting ends are adapted to be plugged to or unplugged from the two first connecting ends, respectively.

In an embodiment of the disclosure, each of the first connecting ends has a guiding part, and each of the second connecting ends is adapted to be plugged to the corresponding first connecting end under guidance of the corresponding guiding part.

In an embodiment of the disclosure, the at least one condensation flow path includes a first pipe, a chiller distribution unit, and a heat exchanger, the chiller distribution unit is disposed on the rack, the first pipe is connected between the first connecting end and the chiller distribution unit of the at least one condensation flow path, and the heat exchanger is disposed on the rack and is connected to the chiller distribution unit.

In an embodiment of the disclosure, the heat exchanger includes a second pipe and a heat dissipation fin group combined together, and is connected to the chiller distribution unit through the second pipe.

In an embodiment of the disclosure, the immersion cooling system includes an airflow generating unit, and the heat exchanger is located between the airflow generating unit and the rack.

In an embodiment of the disclosure, the chassis includes a box body and a case body, the case body is retractably disposed in the box body and is adapted to accommodate the coolant and the heat generating component, and the case body is adapted to be pulled out from an end of the chassis facing an outer side of the rack.

In an embodiment of the disclosure, the immersion cooling module includes a coolant discharge valve, and the coolant discharge valve is disposed at an end of the chassis facing an outer side of the rack.

In an embodiment of the disclosure, the immersion cooling module includes a port panel, and the port panel is disposed at an end of the chassis facing an outer side of the rack.

In an embodiment of the disclosure, the port panel is detachably disposed on the chassis.

In an embodiment of the disclosure, the immersion cooling module includes a sealing structure, and the sealing structure is disposed between the port panel and the chassis.

DESCRIPTION OF THE EMBODIMENTS

Figure 1:
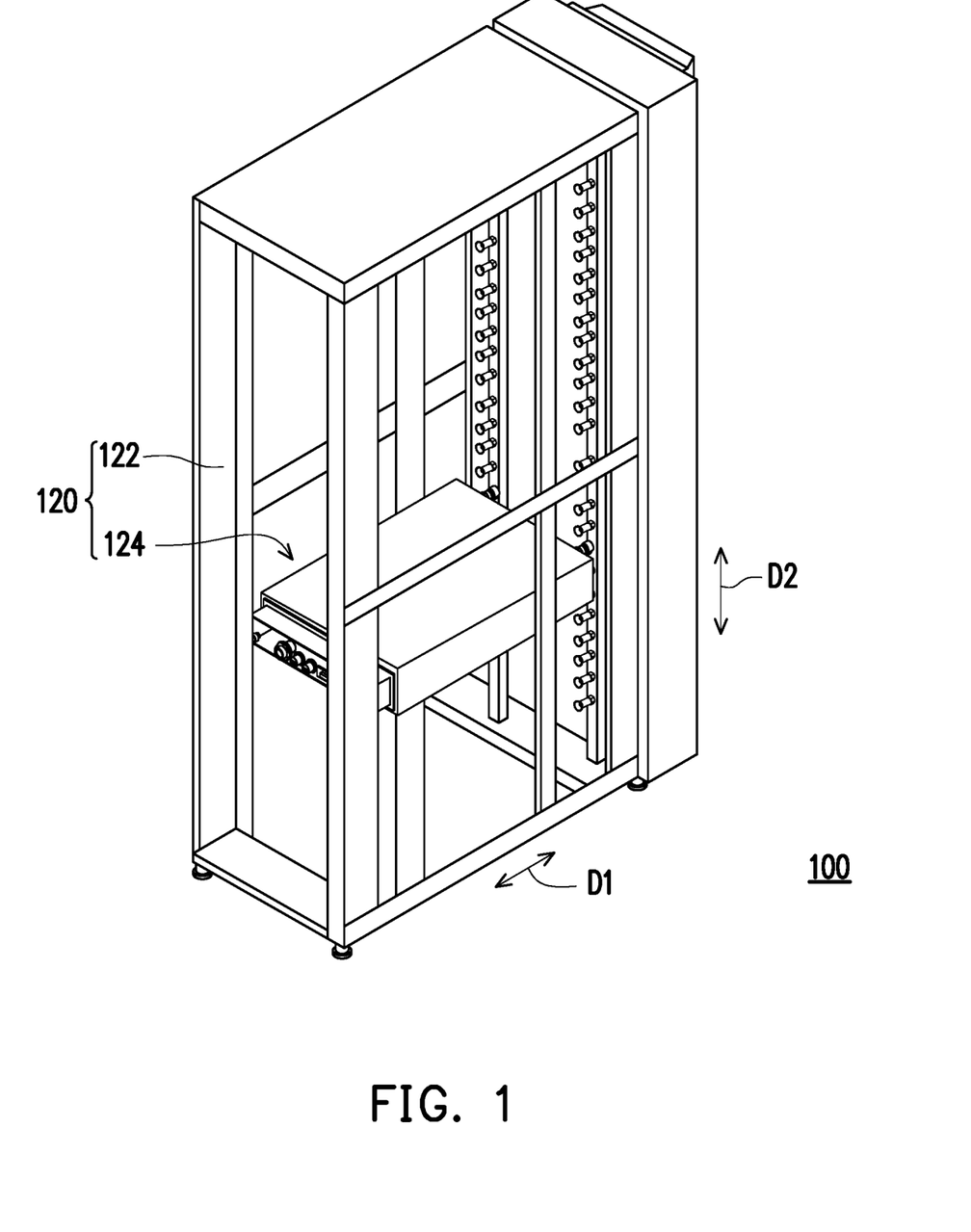
FIG. 1 is a perspective view of partial components of an electronic apparatus according to an embodiment of the disclosure.
Figure 2:
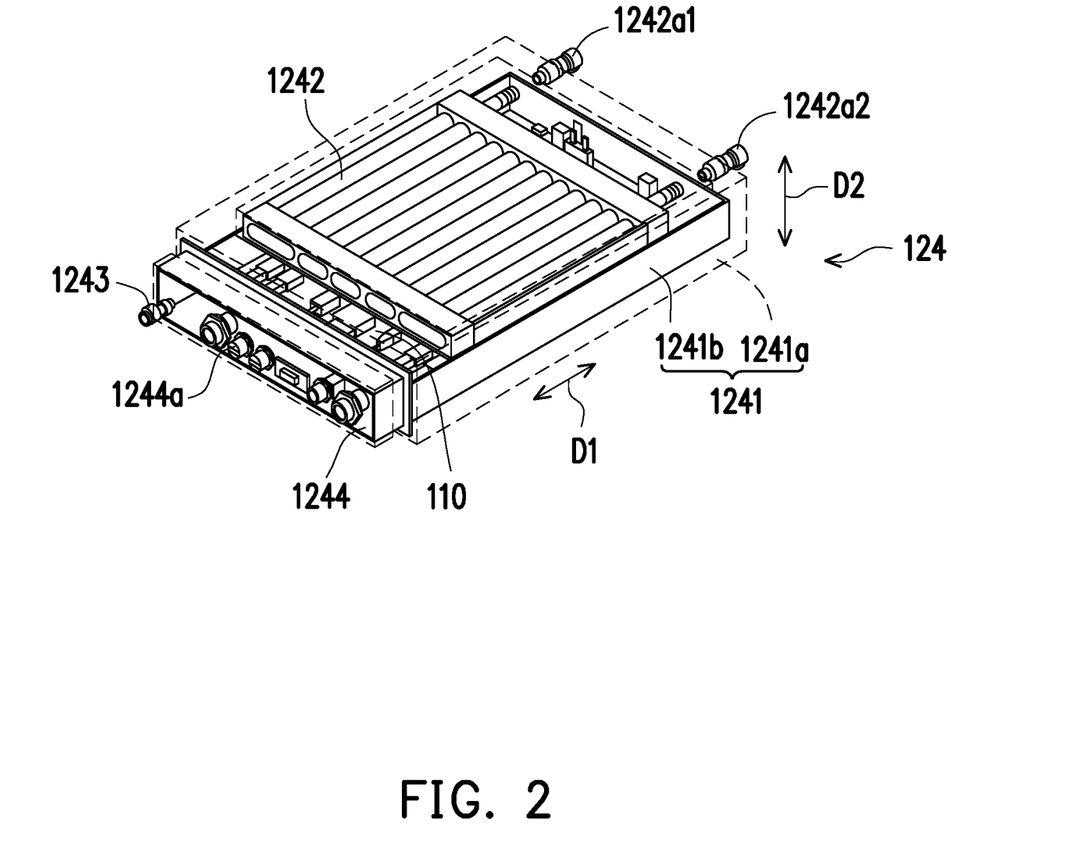
FIG. 2 is an interior perspective view of an immersion cooling module of FIG. 1.
Figure 3:
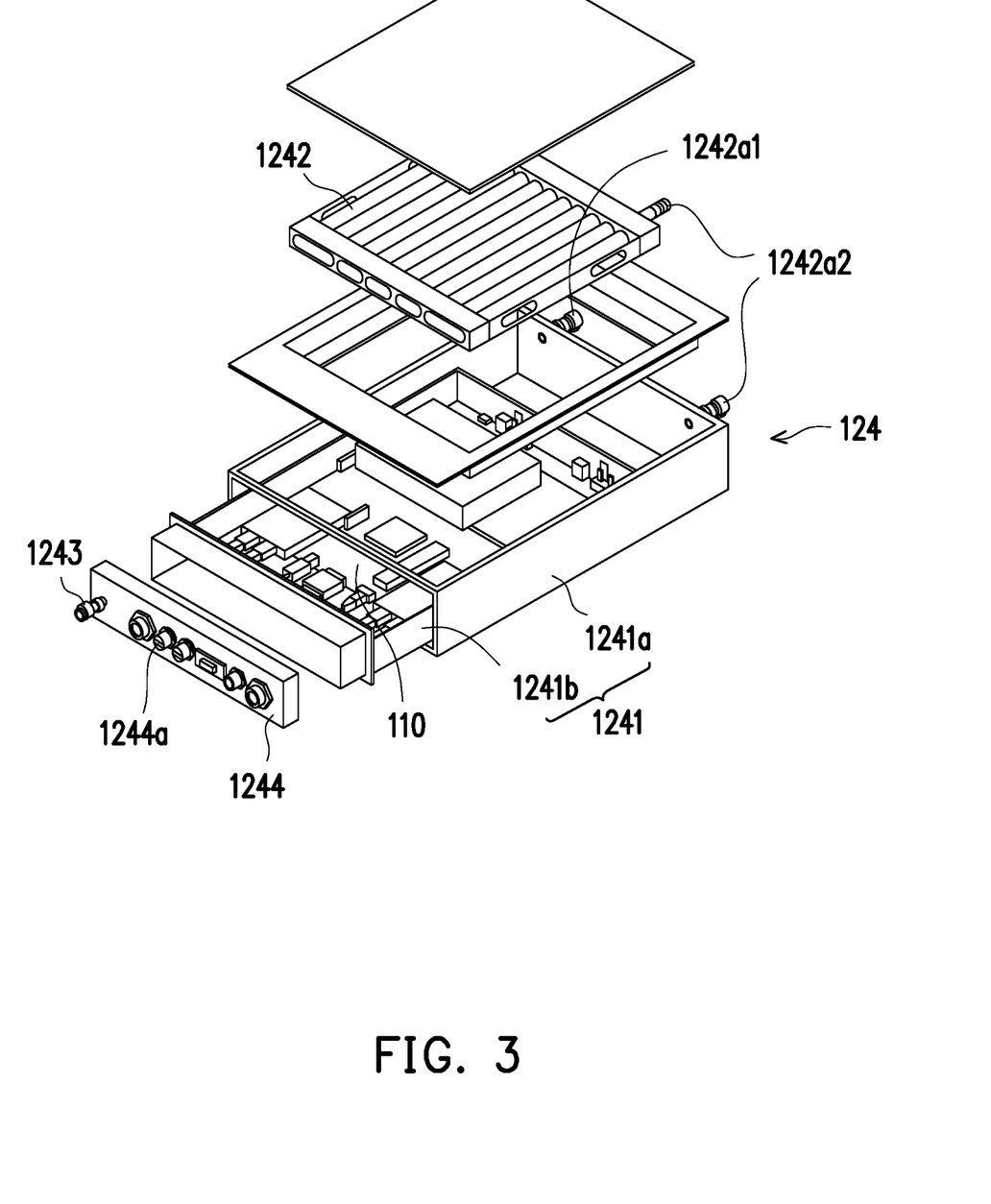
FIG. 3 is an exploded view of the immersion cooling module of FIG. 2.

FIG. 1 is a perspective view of partial components of an electronic apparatus according to an embodiment of the disclosure. FIG. 2 is an interior perspective view of an immersion cooling module of FIG. 1. FIG. 3 is an exploded view of the immersion cooling module of FIG. 2. With reference to FIG. 1 to FIG. 3, an electronic apparatus 100 of this embodiment includes at least one heat generating component 110 and an immersion cooling system 120. The immersion cooling system 120 includes a rack 122 and at least one immersion cooling module 124. The immersion cooling module 124 includes a chassis 1241 and a condensation pipeline 1242. The chassis 1241 is slidably disposed on the rack 122 along a front-rear direction D1 of the rack 122. The heat generating component 110 is, for example, a motherboard and is disposed in the chassis 1241. The condensation pipeline 1242 is disposed in the chassis 1241 and is located above the heat generating component 110 in a top-bottom direction D2 vertical to the front-rear direction D1.

FIG. 1 schematically illustrates one immersion cooling module 124, but in fact, there may be multiple immersion cooling modules 124 sequentially stacked in the rack 122. In addition, the rack 122 may have a slide rail structure in an appropriate form for the chassis 1241 of the immersion cooling module 124 to be slidably disposed on. The slide rail structure is, for example, an existing slide rail of the chassis 1241 for general rack server chassis to be slidably disposed on. The specification of the chassis 1241 of the immersion cooling module 124 may be designed according to the existing slide rail, so that the immersion cooling module 124 is adapted to replace the original rack server chassis to be directly installed on the rack 122.

Figure 4A:
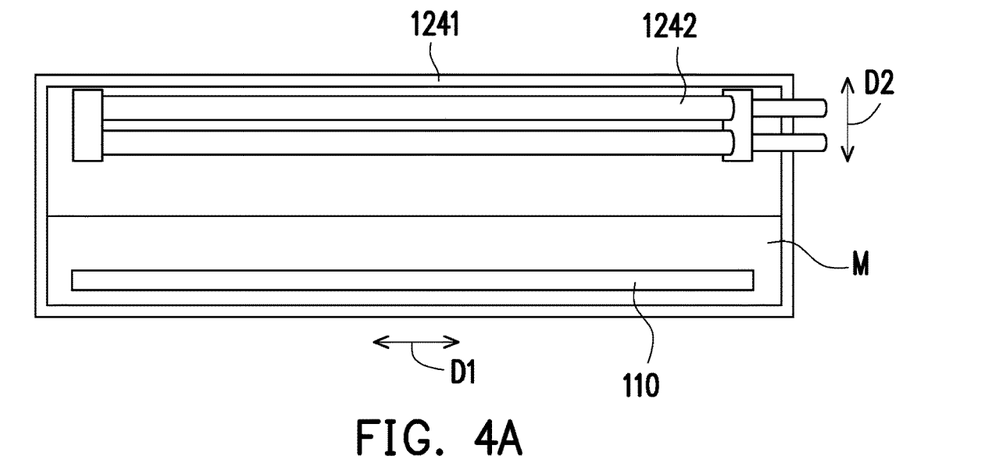
FIG. 4A to FIG. 4C illustrate how partial components of the immersion cooling module in FIG. 2 function.
Figure 4B:
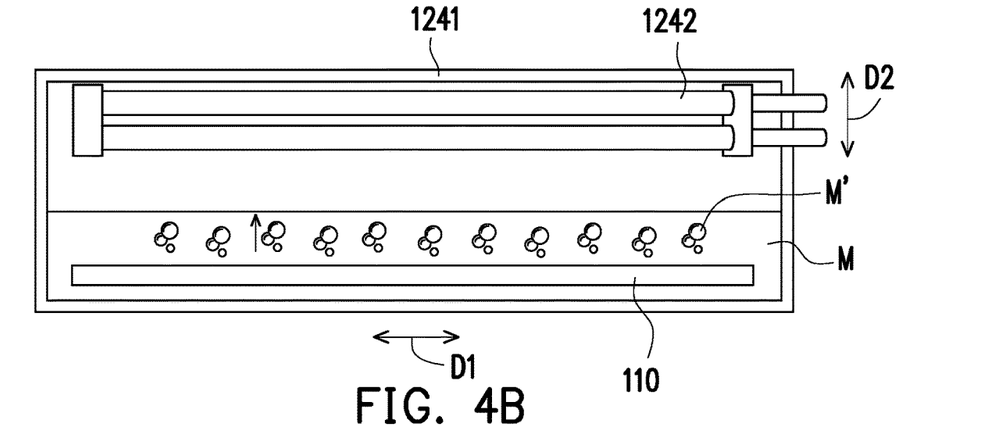
Figure 4C:
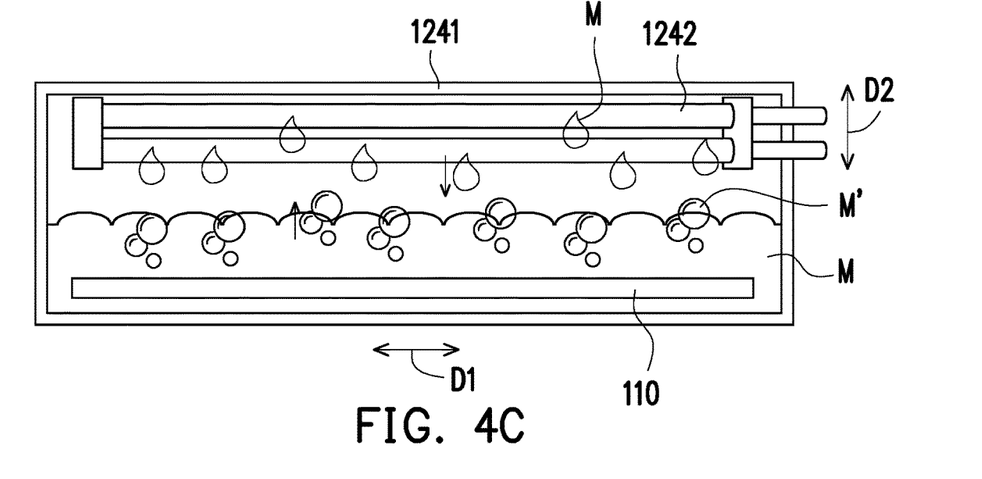

FIG. 4A to FIG. 4C illustrate how partial components of the immersion cooling module in FIG. 2 function. With reference to FIG. 4A, the chassis 1241 is adapted to accommodate a coolant M, and the heat generating component 110 is immersed in the liquid coolant M. The condensation pipeline 1242 is disposed in the chassis 1241 and is located above the liquid coolant M in the top-bottom direction D2 of the rack 122.

The coolant M is, for example, dielectric solution which is liquid at room temperature, such as fluorinated liquid with a boiling point between 40 and 60 degrees Celsius or other appropriate coolant. The disclosure is not limited thereto. As shown in FIG. 4A, when the heat generating component 110 has not yet generated heat or the temperature of the heat generating component 110 is not high, the liquid coolant M does not generate bubbles. When the temperature of the heat generating component 110 is high, the liquid coolant M absorbs the heat generated by the heat generating component 110 to reduce the temperature of the heat generating component 110, and, as shown in FIG. 4B, rapidly boils and vaporizes with the heat generated by the heat generating component 110, thereby generating bubbles, i.e. a gaseous coolant M'. As shown in FIG. 4C, the gaseous coolant M' of high heat energy moves upwards and thereby disturbs the liquid surface of the liquid coolant M. When the gaseous coolant M' of high heat energy flows to the condensation pipeline 1242 in the sealed chassis 1241, the gaseous coolant M' will be cooled by the low-temperature condensate flowing in the condensation pipeline 1242 and condense on the condensation pipeline 1242 as shown in FIG. 4C. After absorbing the heat energy from the coolant M, the condensate in the condensation pipeline 1242 flows out of the immersion cooling module 124 to be cooled by heat exchange, and the cooled condensate flows back into the condensation pipeline 1242 to maintain continuous circulation. On the other hand, droplets of the coolant M condensing on the condensation pipeline 1242 fall back into the liquid coolant M by gravity, achieving an effect of heat dissipation with this circulation.

With the above configuration, the chassis 1241 of the immersion cooling module 124 is slidably disposed on the rack 122, so that multiple immersion cooling modules 124 may be integrated into the rack 122. Therefore, it is more convenient in operation that the immersion cooling module 124 may be plugged to or unplugged from the rack 122 by a user along a direction (i.e. the front-rear direction D1 of the rack 122) in which the chassis 1241 is slidably disposed.

Figure 5:
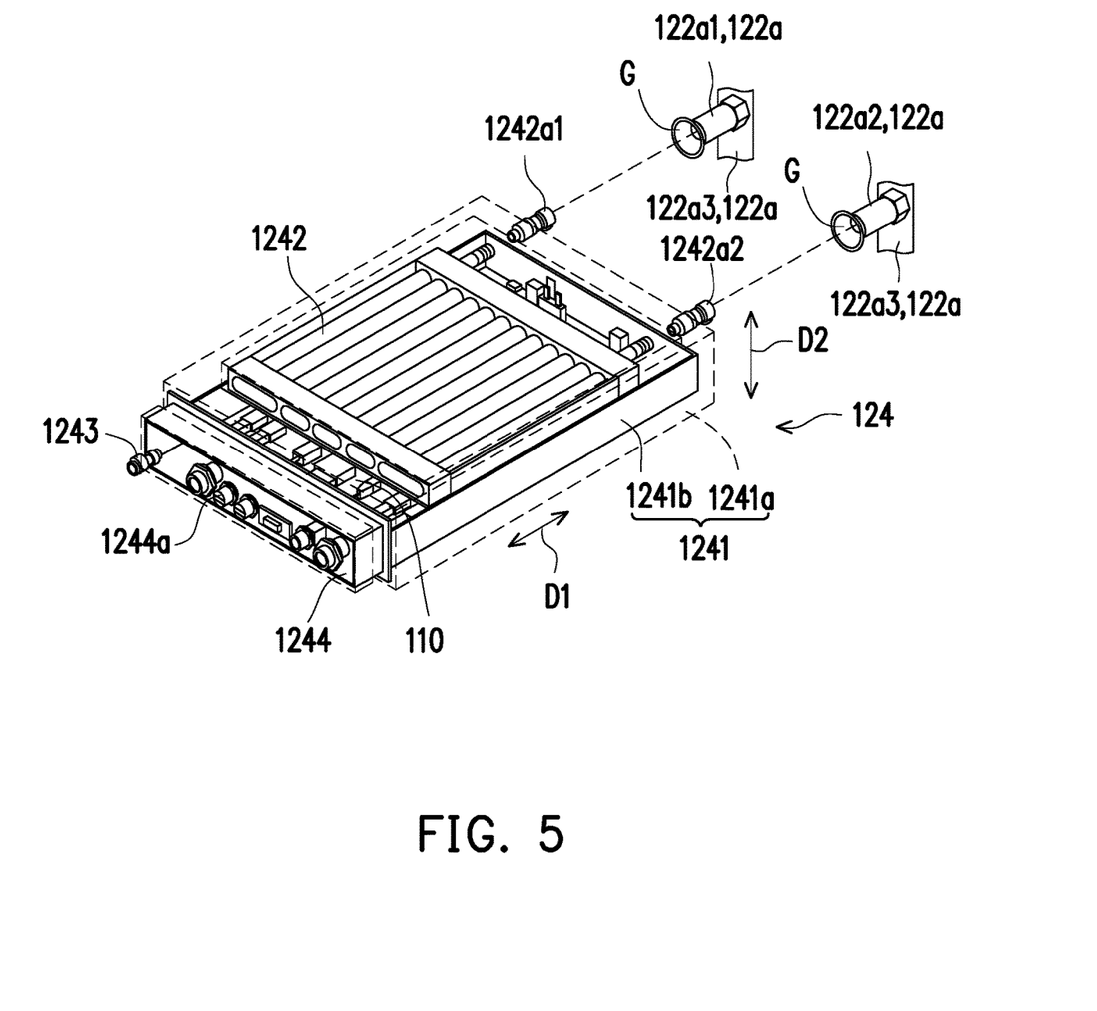
FIG. 5 is an exploded view of partial components of the electronic apparatus in FIG. 1.

FIG. 5 is an exploded view of partial components of the electronic apparatus in FIG. 1. With reference to FIG. 5, the rack 122 of this embodiment has a condensation flow path 122a, and the condensation flow path 122a has two first connecting ends 122a1 and 122a2. The disclosure does not limit the actual configuration and extension of the condensation flow path 122a. FIG. 5 schematically illustrates the first connecting ends 122a1 and 122a2 of the condensation flow path 122a. In addition, the condensation pipeline 1242 of the immersion cooling module 124 have two second connecting ends 1242a1 and 1242a2. The two second connecting ends 1242a1 and 1242a2 are adapted to be plugged to or unplugged from the two first connecting ends 122a1 and 122a2 of the condensation flow path 122a as the chassis 1241 slides along the rack 122, allowing the condensate in the condensation pipeline 1242 to circulate out of the immersion cooling module 124.

In this embodiment, the first connecting ends 122a1 and 122a2 respectively have a guiding part G. The outside diameter of the guiding part G is, for example, greater than the outside diameter of the second connecting ends 1242a1 and 1242a2, and is gradually decreased towards the main bodies of the first connecting ends 122a1 and 122a2 respectively to provide a guiding effect. The second connecting ends 1242a1 and 1242a2 are adapted to be respectively plugged to the corresponding first connecting ends 122a1 and 122a2 under the guidance of the corresponding guiding part G. In this way, the user may smoothly plug the second connecting ends 1242*a*1 and 1242*a*2 to the first connecting ends 122*a*1 and 122*a*2 respectively by intuitively pushing the chassis 1241 of the immersion cooling module 124 into the rack 122.

Figure 6:
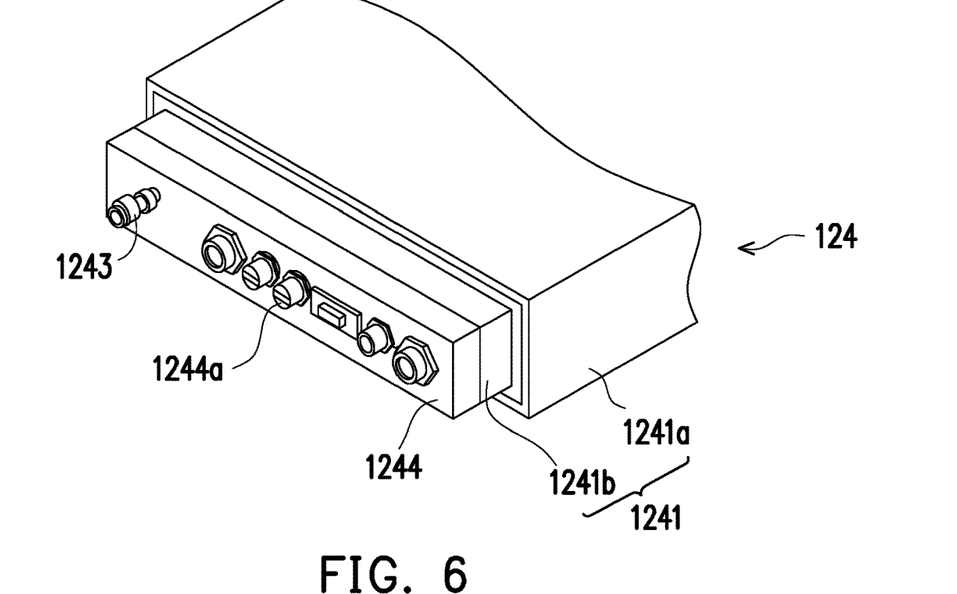
FIG. 6 is a partial perspective view of the immersion cooling module in FIG. 2.
Figure 7:
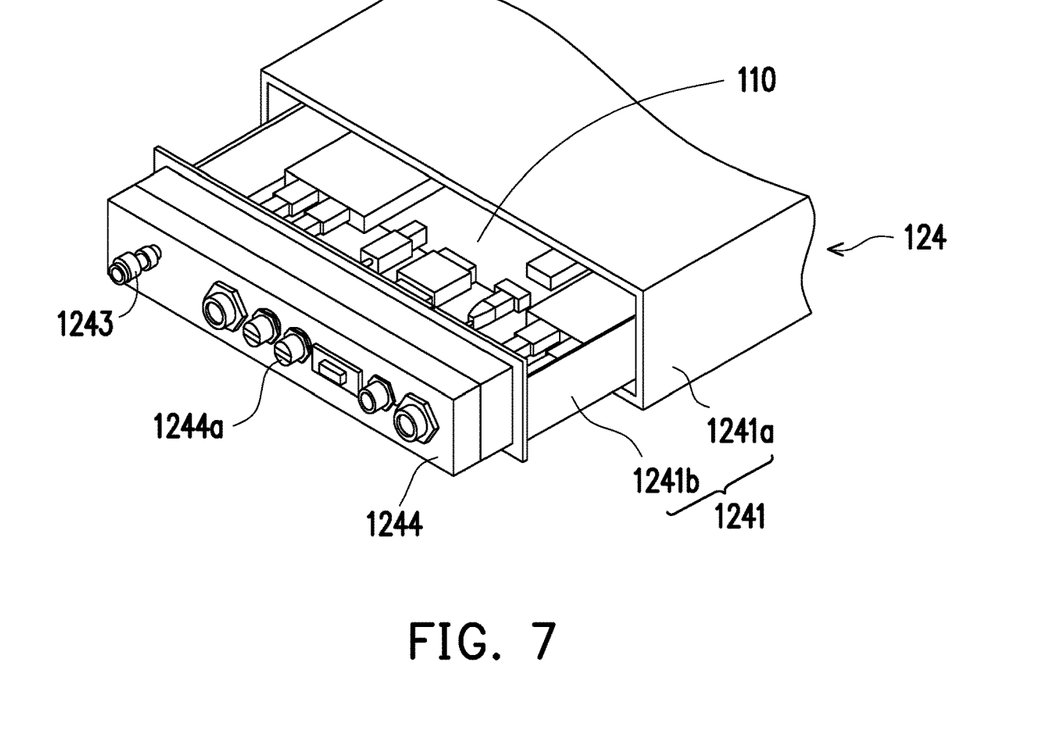
FIG. 7 illustrates how a case body in FIG. 6 is pulled out from a box body.

FIG. 6 is a partial perspective view of the immersion cooling module in FIG. 2. FIG. 7 illustrates how a case body in FIG. 6 is pulled out from a box body. With reference to FIG. 6 and FIG. 7, the chassis 1241 of this embodiment includes a box body 1241*a* and a case body 1241*b*. The case body 1241*b* is retractably disposed in the box body 1241*a*, and is adapted to accommodate the coolant M (shown in FIG. 4) and the heat generating component 110. The case body 1241*b* is adapted to be pulled out from an end of the chassis 1241 facing an outer side of the rack 122 as shown in FIG. 7, allowing the user to easily maintain or replace internal components.

Furthermore, the immersion cooling module 124 of this embodiment includes a coolant discharge valve 1243. The coolant discharge valve 1243 is disposed on the case body 1241*b* and is located at the end of the chassis 1241 facing the outer side of the rack 122. Before the user pulls out the case body 1241*b* from the box body 1241*a*, the coolant discharge valve 1243 may be opened first to discharge the coolant M (shown in FIG. 4) to an external collection tank for storage to avoid the coolant M from diffusing into the external environment when the case body 1241*b* is pulled out. After the user completes the maintenance or replacement of the components in the case body 1241*b* and pushes the case body 1241*b* back as shown in FIG. 6, the coolant M is injected into the case body 1241*b* by the coolant discharge valve 1243.

In addition, the immersion cooling module 124 of this embodiment includes a port panel 1244. The port panel 1244 is disposed on the case body 1241*b* and is located at the end of the chassis 1241 facing the outer side of the rack 122. In this way, the user is allowed to easily connect various external devices through ports 1244*a* (shown as multiple ports) on the port panel 1244. In this embodiment, the coolant discharge valve 1243 is, for example, integrated on the port panel 1244.

Figure 8:
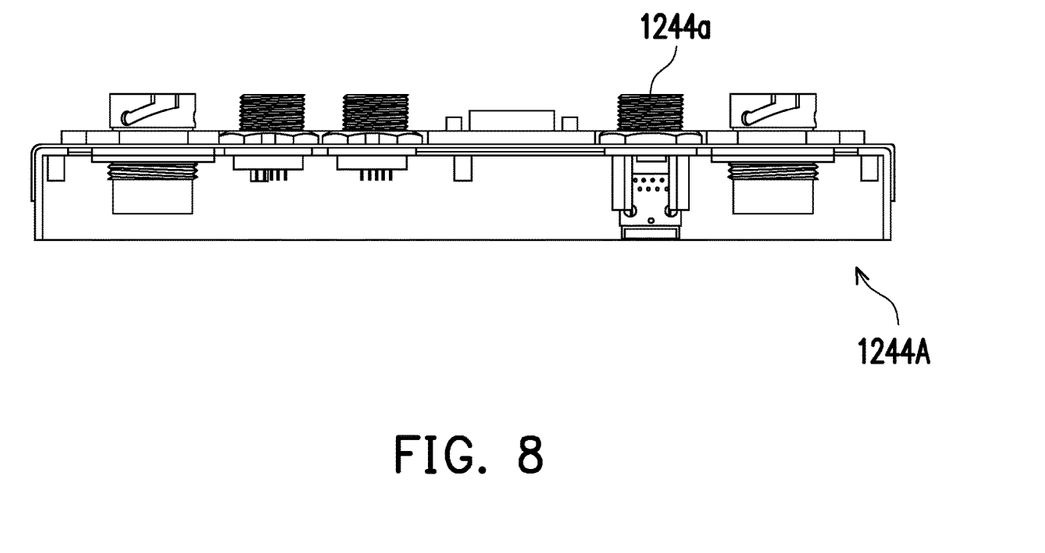
FIG. 8 is a partial perspective view of an immersion cooling module according to another embodiment of the disclosure.
Figure 9:
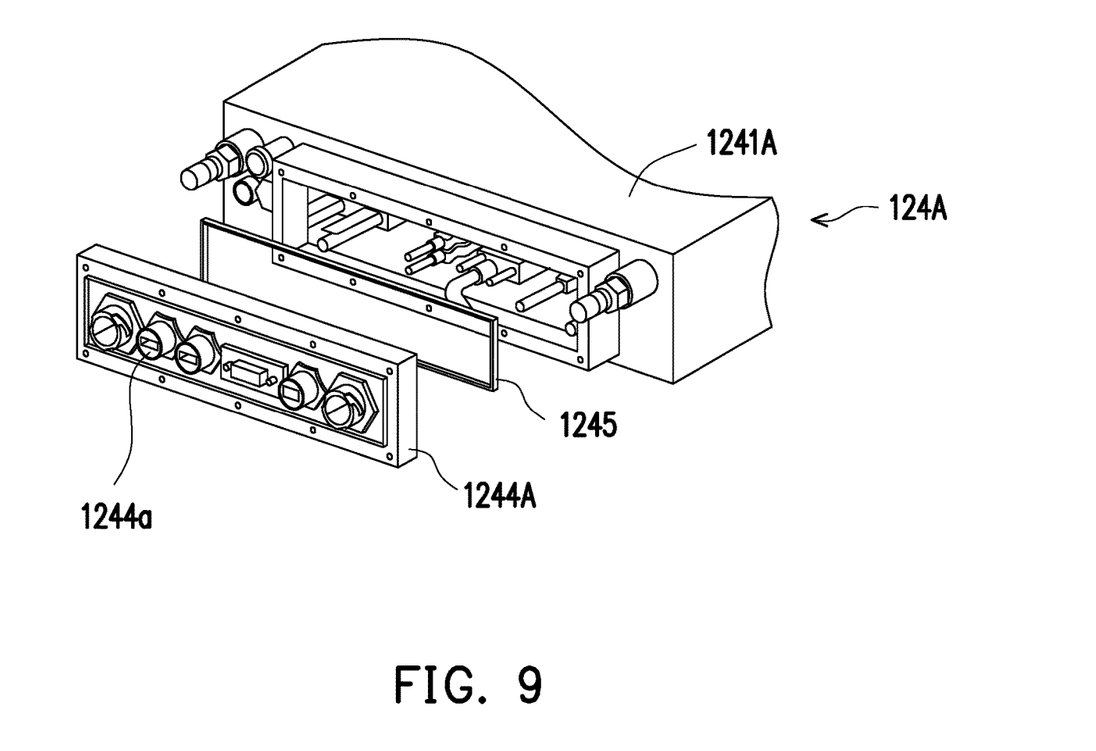
FIG. 9 is an exploded view of the immersion cooling module of FIG. 8.

FIG. 8 is a partial perspective view of an immersion cooling module according to another embodiment of the disclosure. FIG. 9 is an exploded view of the immersion cooling module of FIG. 8. The difference between an immersion cooling module 124A shown in FIG. 8 and FIG. 9 and the immersion cooling module 124 of the previous embodiment is that a port panel 1244A of the immersion cooling module 124A may be detachably disposed on a chassis 1241A. In addition, the immersion cooling module 124A further includes a sealing structure 1245. The sealing structure 1245 is disposed between the port panel 1244A and the chassis 124A to achieve a sealing effect to avoid the coolant from leaking out through a gap between the port panel 1244A and the chassis 124A. The sealing structure 1245 may be a sealing ring, or may be formed by potting, and the disclosure does not limit its specific form.

Figure 10:
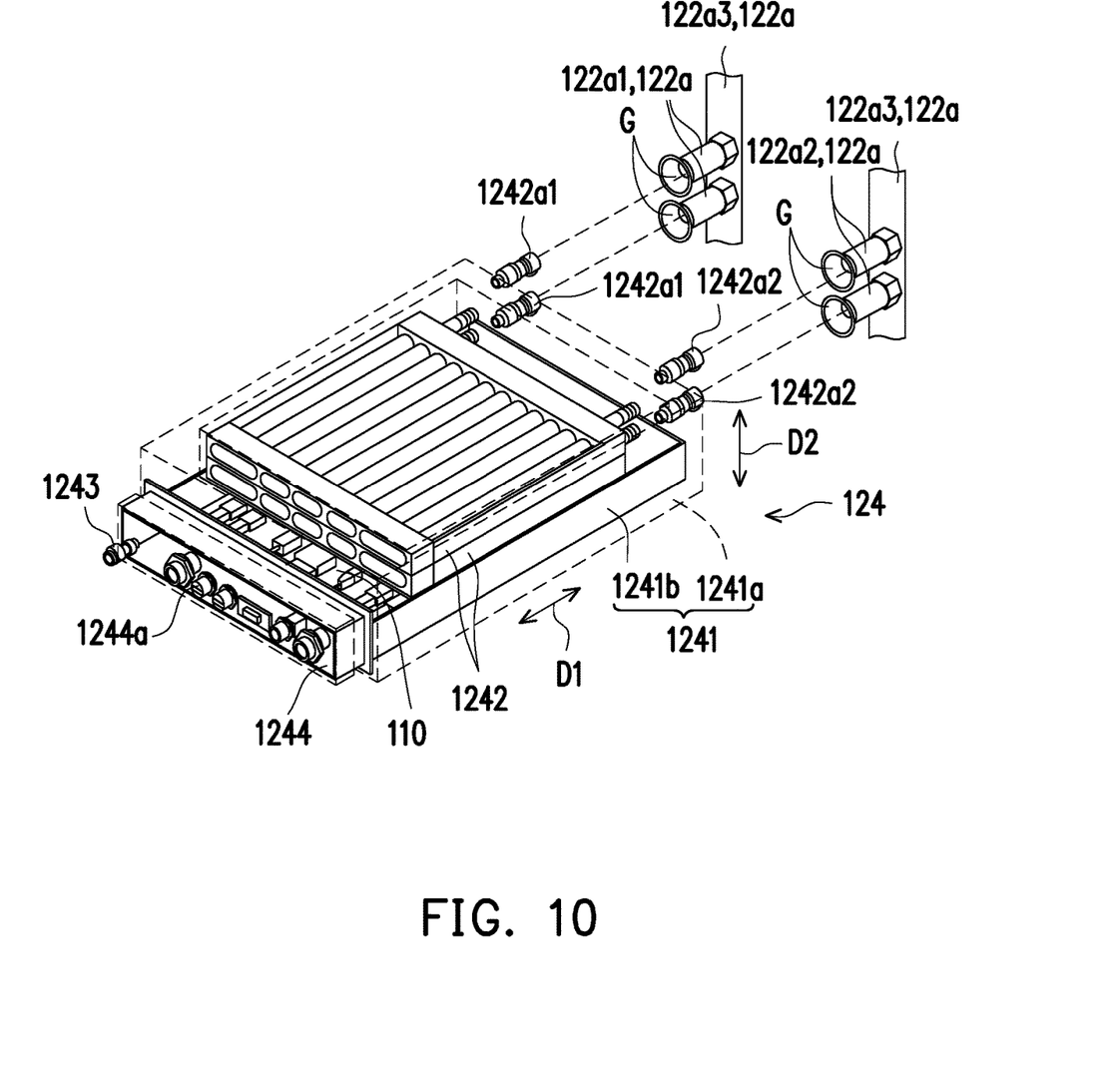
FIG. 10 is a perspective view of partial components of an electronic apparatus according to another embodiment of the disclosure.

FIG. 10 is a perspective view of partial components of an electronic apparatus according to another embodiment of the disclosure. The difference between the embodiment shown in FIG. 10 and the embodiment shown in FIG. 5 is that there are two condensation flow paths 122*a* and two condensation pipelines 1242 of the immersion cooling module 124 in FIG. 10. Therefore, there are a total of four first connecting ends, i.e. two first connecting ends 122*a*1 and 122*a*2 of one condensation flow path 122*a* and another two first connecting ends 122*a*1 and 122*a*2 of the other condensation flow path 122*a*, and there are a total of four second connecting ends, i.e. two second connecting ends 1242*a*1 and 1242*a*2 of one condensation pipeline 1242 and another two second connecting ends 1242*a*1 and 1242*a*2 of the other condensation pipeline 1242. The two first connecting ends 122*a*1 and 122*a*2 of one condensation flow path 122*a* are adapted to be respectively plugged to or unplugged from the two first connecting ends 122*a*1 and 122*a*2 of the corresponding condensation flow path 122*a*, whereas the two first connecting ends 122*a*1 and 122*a*2 of the other condensation flow path 122*a* are adapted to be respectively plugged to or unplugged from the two first ends 122*a*1 and 122*a*2 of the other corresponding condensation flow path 122*a*, so that the condensate in the condensation pipelines 1242 may circulate out of the immersion cooling module 124. In other embodiments, the number of the condensation flow path 122*a* and the condensation pipeline 1242 may be more, and it is not limited by the disclosure.

Figure 11:
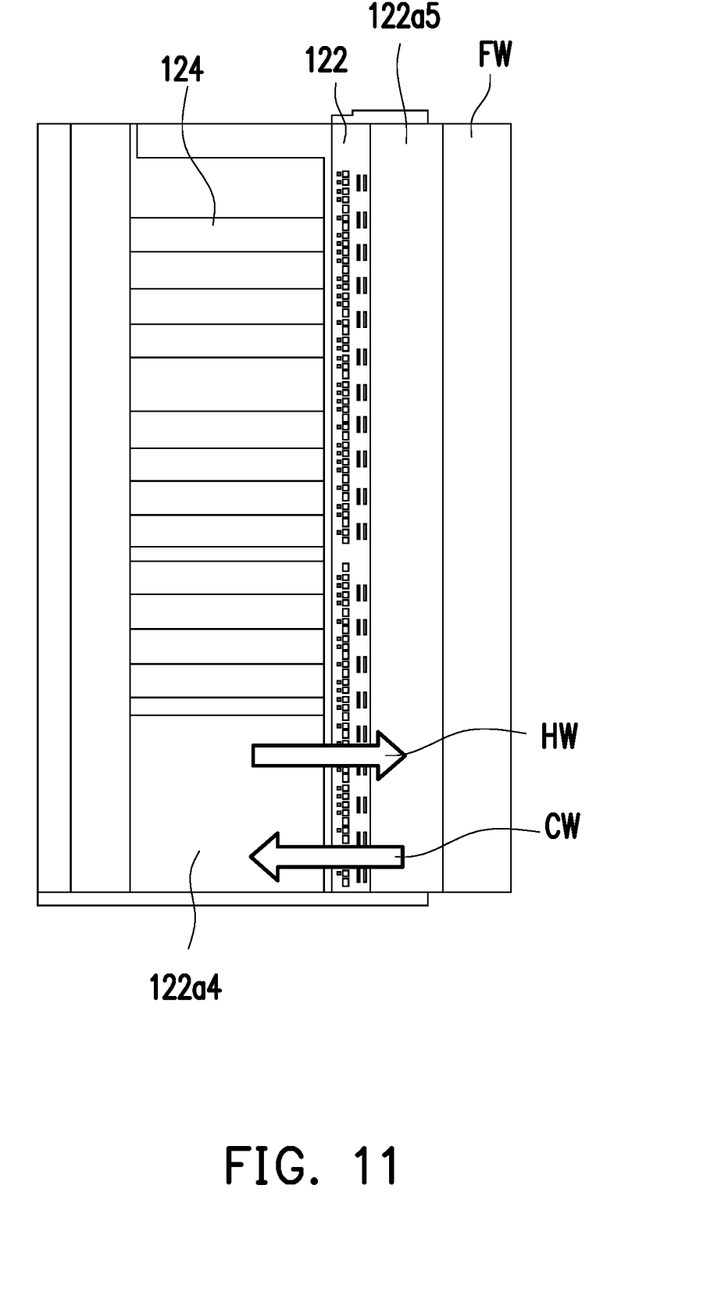
FIG. 11 is a schematic side view of the electronic apparatus in FIG. 1.
Figure 12:
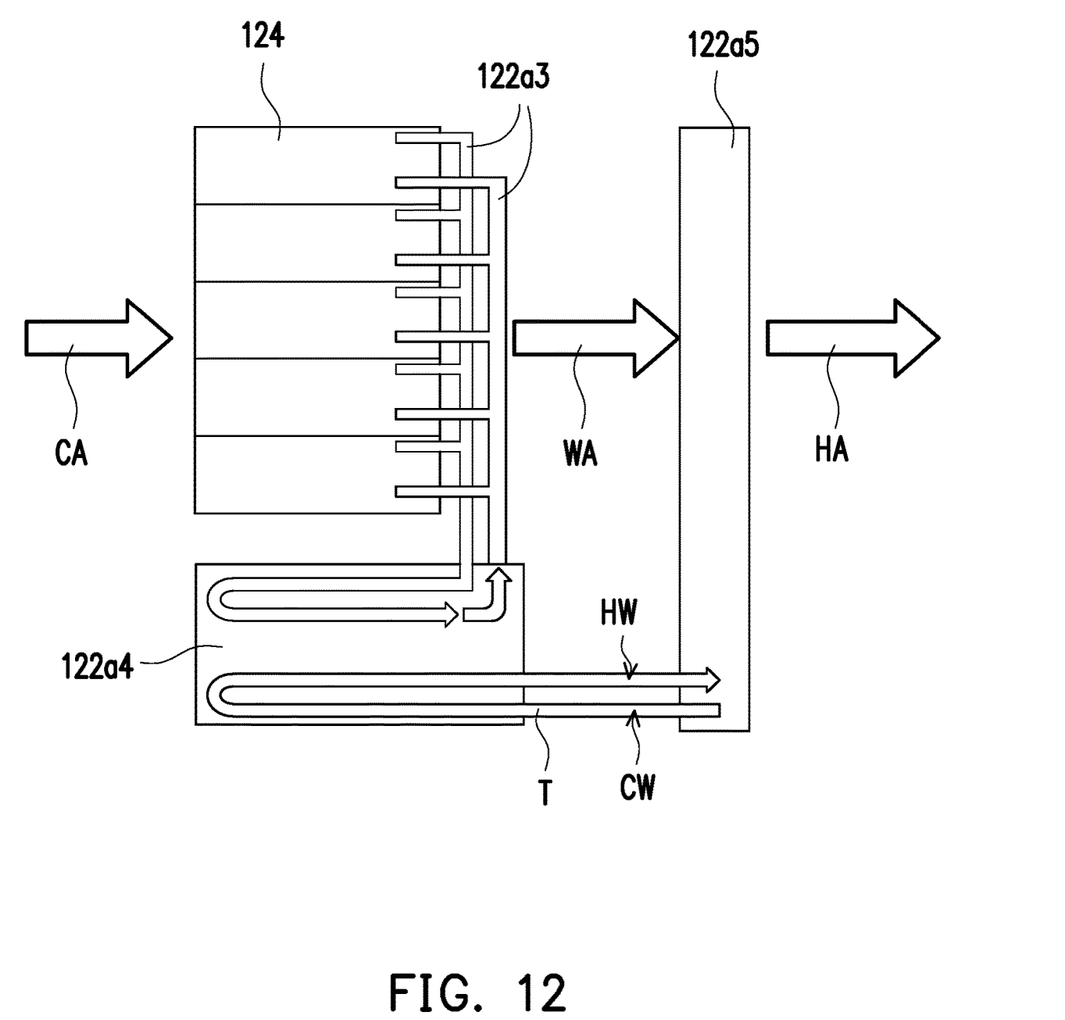
FIG. 12 illustrates how the electronic apparatus in FIG. 11 functions in condensation.
Figure 13:
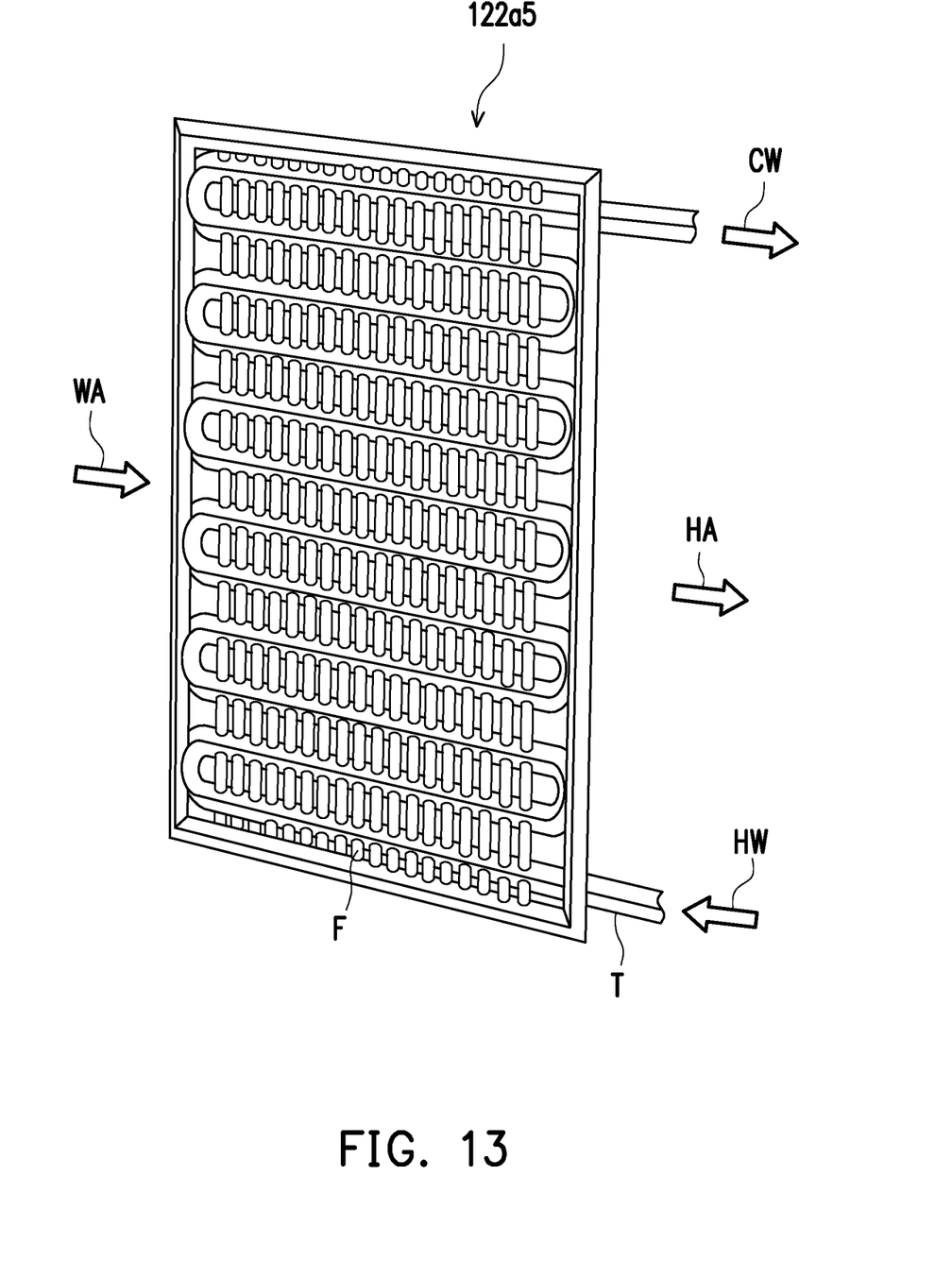
FIG. 13 is a perspective view of a rear door heat exchanger of FIG. 11.

The condensation flow path 122*a* of the previous embodiment is described in detail below. FIG. 11 is a schematic side view of the electronic apparatus in FIG. 1. FIG. 12 illustrates how the electronic apparatus in FIG. 11 functions in condensation. FIG. 13 is a perspective view of a rear door heat exchanger of FIG. 11. With reference to FIG. 11 and FIG. 12, the condensation flow path 122*a* of this embodiment includes a first pipe 122*a*3, a chiller distribution unit (CDU) 122*a*4, and a rear door heat exchanger (RDHX) 122*a*5. The CDU 122*a*4 is disposed at the bottom of the rack 122. The first pipe 122*a*3 is connected between the first connecting ends 122*a*1, 122*a*2 (shown in FIG. 5) and the CDU 122*a*4 of the condensation flow path 122*a*. The RDHX 122*a*5 is disposed on a rear side of the rack 122 and is connected to the CDU 122*a*4. The RDHX 122*a*5 includes a second pipe T and a heat dissipation fin group F combined together as shown in FIG. 13, and is connected to the CDU 122*a*4 through the second pipe T as shown in FIG. 12. In addition, an airflow generating unit FW is disposed on a rear side of the RDHX 122*a*5 as shown in FIG. 11, so that the RDHX 122*a*5 is located between the airflow generating unit FW and the rack 122. The airflow generating unit FW is, for example, a fan wall composed of multiple fans.

The high-temperature condensate in the condensation pipeline 1242 (shown in FIG. 5) in each of the immersion cooling modules 124 may pass through the first pipe 122*a*3 to reach the CDU 122*a*4 as shown in FIG. 12 to be turn cold water CW in the second pipe T into hot water HW by heat exchange for circulating to the RDHX 122*a*5. The hot water HW transfers heat to the heat dissipation fin group F shown in FIG. 13 at the RDHX 122*a*5, and is cooled to become the cold water CW for circulating to the CDU 122*a*4. The airflow generating unit FW may drive cold air CA (shown in FIG. 12) through the immersion cooling module 124 to become warm air WA and flow to the RDHX 122*a*5. The warm air WA becomes hot air HA by heat exchange with the heat dissipation fin group F, and is discharged to a rear side of the airflow generating unit FW.

What is claimed is:

1. An immersion cooling system, comprising: a rack; and at least one immersion cooling module, comprising a chassis and at least one condensation pipeline, wherein the chassis is slidably disposed on the rack and is adapted to accommodate a coolant, at least one heat generating component is adapted to be disposed in the chassis to be immersed in the coolant in a liquid state, and the at least one condensation pipeline is disposed in the chassis and is located above the coolant in the liquid state, wherein the chassis comprises a box body and a case body, the case body is retractably disposed in the box body and is configured to hold the coolant and the at least one heat generating component, and the case body is adapted to be pulled out from an end of the chassis facing an outer side of the rack.

2. The immersion cooling system according to claim 1, wherein the chassis is slidably disposed in a front-rear direction of the rack, and the at least one condensation pipeline is located above the coolant in the liquid state in a top-bottom direction vertical to the front-rear direction of the rack.

3. The immersion cooling system according to claim 1, wherein the rack has at least one condensation flow path, and the at least one condensation pipeline is adapted to be plugged to or unplugged from the at least one condensation flow path as the chassis slides along the rack.

4. The immersion cooling system according to claim 3, wherein the at least one condensation flow path has two first connecting ends, the at least one condensation pipeline has two second connecting ends, and the two second connecting ends are adapted to be plugged to or unplugged from the two first connecting ends, respectively.

5. The immersion cooling system according to claim 4, wherein each of the first connecting ends has a guiding part, and each of the second connecting ends is adapted to be plugged to a corresponding one of the first connecting ends under guidance of a corresponding one of the guiding parts.

6. The immersion cooling system according to claim 3, wherein the at least one condensation flow path comprises a first pipe, a chiller distribution unit, and a heat exchanger, the chiller distribution unit is disposed on the rack, the first pipe is connected between the first connecting end and the chiller distribution unit of the at least one condensation flow path, and the heat exchanger is disposed on the rack and is connected to the chiller distribution unit.

7. The immersion cooling system according to claim 6, wherein the heat exchanger comprises a second pipe and a heat dissipation fin group combined together, and is connected to the chiller distribution unit through the second pipe.

8. The immersion cooling system according to claim 6, comprising an airflow generating unit, wherein the heat exchanger is located between the airflow generating unit and the rack.

9. The immersion cooling system according to claim 1, wherein the at least one immersion cooling module comprises a coolant discharge valve, and the coolant discharge valve is disposed at an end of the chassis facing an outer side of the rack to discharge the coolant.

10. The immersion cooling system according to claim 1, wherein the at least one immersion cooling module comprises a port panel, and the port panel is disposed at an end of the chassis facing an outer side of the rack.

11. The immersion cooling system according to claim 10, wherein the port panel is detachably disposed on the chassis.

12. The immersion cooling system according to claim 10, wherein the at least one immersion cooling module comprises a sealing structure, and the sealing structure is disposed between the port panel and the chassis.

13. An electronic apparatus, comprising: at least one heat generating component; and an immersion cooling system, comprising: a rack; and at least one immersion cooling module, comprising a chassis and at least one condensation pipeline, wherein the chassis is slidably disposed on the rack and is adapted to accommodate a coolant, the at least one heat generating component is disposed in the chassis to be immersed in the coolant in a liquid state, and the at least one condensation pipeline is disposed in the chassis and is located above the coolant in the liquid state, wherein the chassis comprises a box body and a case body, the case body is retractably disposed in the box body and is configured to hold the coolant and the at least one heat generating component, and the case body is adapted to be pulled out from an end of the chassis facing an outer side of the rack.

14. The electronic apparatus according to claim 13, wherein the chassis is slidably disposed in a front-rear direction of the rack, and the at least one condensation pipeline is located above the coolant in the liquid state in a top-bottom direction vertical to the front-rear direction of the rack.

15. The electronic apparatus according to claim 13, wherein the rack has at least one condensation flow path, and the at least one condensation pipeline is adapted to be plugged to or unplugged from the at least one condensation flow path as the chassis slides along the rack.

16. The electronic apparatus according to claim 15, wherein the at least one condensation flow path has two first connecting ends, the at least one condensation pipeline has two second connecting ends, and the two second connecting ends are adapted to be plugged to or unplugged from the two first connecting ends, respectively.

17. The electronic apparatus according to claim 16, wherein each of the first connecting ends has a guiding part, and each of the second connecting ends is adapted to be plugged to a corresponding one of the first connecting ends under guidance of a corresponding one of the guiding parts.

18. The electronic apparatus according to claim 15, wherein the at least one condensation flow path comprises a first pipe, a chiller distribution unit, and a heat exchanger, the chiller distribution unit is disposed on the rack, the first pipe is connected between the first connecting end and the chiller distribution unit of the at least one condensation flow path, and the heat exchanger is disposed on the rack and is connected to the chiller distribution unit.

19. The electronic apparatus according to claim 18, wherein the heat exchanger comprises a second pipe and a heat dissipation fin group combined together, and is connected to the chiller distribution unit through the second pipe.

20. The electronic apparatus according to claim 18, wherein the immersion cooling system comprises an airflow generating unit, and the heat exchanger is located between the airflow generating unit and the rack.

21. The electronic apparatus according to claim 13, wherein the at least one immersion cooling module comprises a coolant discharge valve, and the coolant discharge valve is disposed at an end of the chassis facing an outer side of the rack to discharge the coolant.

22. The electronic apparatus according to claim 13, wherein the at least one immersion cooling module comprises a port panel, and the port panel is disposed at an end of the chassis facing an outer side of the rack.

23. The electronic apparatus according to claim 22, wherein the port panel is detachably disposed on the chassis.

24. The electronic apparatus according to claim 22, wherein the at least one immersion cooling module comprises a sealing structure, and the sealing structure is disposed between the port panel and the chassis.

\* \* \* \* \*